(12) United States Patent
Moriya et al.

(10) Patent No.: US 7,767,504 B2
(45) Date of Patent: Aug. 3, 2010

(54) METHODS FOR FORMING FILM PATTERNS BY DISPOSING A LIQUID WITHIN A PLURAL-LEVEL PARTITION STRUCTURE

(75) Inventors: Katsuyuki Moriya, Azumino (JP); Toshimitsu Hirai, Chino (JP)

(73) Assignee: Seiko Epson Corporation (JP)

( * ) Notice: Subject to any disclaimer, the term of this patent is extended or adjusted under 35 U.S.C. 154(b) by 510 days.

(21) Appl. No.: 11/689,533

(22) Filed: Mar. 22, 2007

(65) Prior Publication Data

US 2007/0246723 A1  Oct. 25, 2007

(30) Foreign Application Priority Data

Apr. 19, 2006  (JP) ............... 2006-115428

(51) Int. Cl.
*H01L 21/00* (2006.01)
(52) U.S. Cl. ............... 438/158; 257/E21.174; 257/E21.479
(58) Field of Classification Search ........ 438/158; 257/E21.174, E21.479
See application file for complete search history.

(56) References Cited

U.S. PATENT DOCUMENTS 6,801,274 B2  10/2004  Suzuki

2005/0003166 A1*  1/2005  Hirai .............. 428/195.1
2005/0042850 A1*  2/2005  Sakai et al. ........... 438/597

FOREIGN PATENT DOCUMENTS

| JP | 11-274671 | 10/1999 |
|---|---|---|
| JP | 2002-098994 | 4/2002 |
| JP | 2003-167245 | 6/2003 |
| JP | 2004-305989 | 11/2004 |
| JP | 2004-349638 | 12/2004 |
| JP | 2004-349640 | 12/2004 |
| JP | 2005-12181 | 1/2005 |
| JP | 2005-19955 | 1/2005 |
| JP | 2005-046828 | 2/2005 |
| JP | 2006-040680 | 2/2006 |
| JP | 2006-245525 | 9/2006 |

* cited by examiner

*Primary Examiner*—Hsien-ming Lee
*Assistant Examiner*—Kevin Parendo
(74) *Attorney, Agent, or Firm*—Harness, Dickey & Pierce, P.L.C.

(57) ABSTRACT

A method for forming a film pattern by disposing a functional liquid in a pattern forming region partitioned by a bank includes: disposing a first bank forming material to a substrate so as to form a first bank layer; and forming a second bank layer on the first bank layer, wherein the first bank forming material is an organic material while the second bank layer is made of a fluorine resin material covering the first bank layer.

7 Claims, 11 Drawing Sheets

METHODS FOR FORMING FILM PATTERNS BY DISPOSING A LIQUID WITHIN A PLURAL-LEVEL PARTITION STRUCTURE

BACKGROUND

1. Technical Field

The present invention relates to a method for forming a film pattern, a method for manufacturing an active matrix substrate, a device, an electro-optical device, and an electronic apparatus.

2. Related Art

A semiconductor device provided with a circuit wiring having a conductive thin film (film pattern) thereon, a thin film such as an insulating film to cover the circuit wiring, and a semiconductor thin film that are laminated on a substrate has heretofore been known. In order to efficiently form a thin film for such a semiconductor device, a droplet discharge method (inkjet method) has also been known. The method is to form a thin film by discharging droplets of a functional liquid containing a thin-film material, etc. as dispersed substance from a droplet discharge head and drying the functional liquid that has been landed so as to remove a dispersion medium (for example, refer to JP-A-11-274671.)

When a thin film serving as a film pattern is formed with the droplet discharge method, commonly, a bank is formed to partition a film pattern forming region and a functional liquid is discharged to the film pattern forming region being a recess formed by partitioned with the bank. Then, the functional liquid landed on the forming region in the recess is dried, forming a film pattern.

With such a method, for example, a source wiring or a drain wiring (film pattern) to connect a semiconductor layer for a bottom gate typed thin-film transistor can be formed. In this case, a bank is formed on a gate insulating film and a functional liquid is discharged onto a region to be a recess partitioned by the bank. The functional liquid is dried so as to be a source wiring or drain wiring connecting with a semiconductor layer.

Although all of the droplets of the functional liquid that have been discharged to be landed in the recess are preferably placed in the recess, part of them may be placed on the upper surface of the bank. In that case, in order to let the droplets flow into the recess without adhering onto the upper surface of the bank, the upper surface of the bank needs to be lyophobic to the functional liquid. Here, a liquid repellent treatment for an upper surface of a bank is commonly performed by a plasma treatment using $CF_4$ gas after the bank is patterned in a final bank shape from a bank member made of a resist member (refer to JP-A-2005-19955.)

However, the above-mentioned related art technique has the following setbacks.

A bank may be made of an inorganic material to improve heat resistance. However, since inorganic materials are expensive, a manufacturing cost for film forming increases. Further, a cost of a semiconductor device including a film pattern formed by using such organic materials also increases.

SUMMARY

An advantage of the invention is to provide a method for forming a film pattern, a method for manufacturing an active matrix substrate, a device, an electro-optical device, and an electronic apparatus that can contribute to reduction of their manufacturing costs.

Aspects of the invention will be described below.

A method for forming a film pattern by disposing a functional liquid in a pattern forming region partitioned by a bank according to a first aspect of the invention, includes: disposing a first bank forming material to a substrate so as to form a first bank layer; and forming a second bank layer on the first bank layer. The first bank forming material is an organic material while the second bank layer is made of a fluorine resin material covering the first bank layer.

Accordingly, in the method for forming a film pattern according to the aspect of the invention, the second bank layer formed on the top of the layers is made of a fluorine resin material having lyophobicity, providing the second bank layer excellent lyophobicity. The functional liquid disposed in the pattern forming region is thus favorably kept therein. In the aspect of the invention, the first bank layer is formed by using an organic material that is less expensive than an inorganic material, contributing reduction of manufacturing cost.

The method according to the aspect of the invention may further includes: disposing a first functional liquid in the pattern forming region; forming a first dried film by drying the first functional liquid in the pattern forming region; and disposing a second functional liquid on the first dried film. A thickness of the first dried film made of the first functional liquid being dried may preferably be smaller than a thickness of the first bank layer.

Accordingly, the method can preferably be used for forming a film pattern having a multilayered structure.

When forming the film pattern having a multilayered structure, the thickness of the first dried film is preferably thinner than that of the first bank layer so that the second functional liquid disposed on the surface of the first dried film also wets and spreads well. As a result, the second functional liquid can utilize an effect of the sidewall of the first bank to enhance a functional liquid to wet and spread.

The method according to the aspect of the invention may further include disposing a functional liquid in the pattern forming region, forming a dried film by drying the functional liquid in the pattern forming region, and firing the bank and the dried film at once.

Accordingly, the method can reduce a processing time in the film forming process since the firing step for the bank only can be omitted, thereby manufacturing efficiency of a device can be increased.

Further, in the method, after a plurality of dried films are layered in the pattern forming region, the plurality of dried films and the bank may preferably be fired at once.

Therefore, even if a film pattern to be formed has a multilayered structure, the bank and the film pattern can be fired at once, thereby efficiency in film pattern forming step can be increased.

In the method, a thickness of the second bank layer may preferably be formed to be smaller than a thickness of the first bank layer.

Accordingly, in the method, a large volume of a functional liquid can be disposed in the pattern forming region, thereby a film pattern having a relatively thick thickness can be easily and uniformly formed.

A device according to a second aspect of the invention may include a bank formed on a substrate by using the method for forming a film pattern according to the first aspect of the invention, the pattern forming region surrounded by the bank, and a film pattern formed in the pattern forming region.

According to this, the device according to the aspect of the invention can be manufactured with a low cost.

Further, the device may include the film pattern formed in the pattern forming region as a gate electrode. Accordingly using the method for forming a film pattern described above, a device provided with a switching element having a gate electrode can be manufactured with a low cost.

Further, the device may include the film pattern formed in the pattern forming region as a source electrode. Accordingly using the method for forming a film pattern described above, a device provided with a switching element having a source electrode can be manufactured with a low cost.

Further, the device may include the film pattern formed in the pattern forming region as a drain electrode. Accordingly using the method for forming a film pattern described above, a device provided with a switching element having a drain electrode can be manufactured with a low cost.

An electro-optical device according to a third aspect of the invention may include the device according to the second aspect of the invention.

Further, an electronic apparatus according to a fourth aspect of the invention may include the electro-optical device according to the third aspect of the invention.

Therefore, according to the aspects of the invention, by including a device with a reduced manufacturing cost, an electro-optical device and an electronic apparatus with a low cost can be provided.

A method for manufacturing an active matrix substrate according to a fifth aspect of the invention includes: (a) forming a gate wiring line on a substrate; (b) forming a gate insulation film on the gate wiring line; (c) forming a semiconductor layer on the gate insulation film; (d) forming a source electrode and a drain electrode on the gate insulation film; (e) disposing an insulation material on the source electrode and the drain electrode; and (f) forming a pixel electrode on the insulation material. The method for forming a film pattern according to the first aspect of the invention may be used in at least one of steps (a), (d), and (f).

A method for manufacturing an active matrix substrate according to a sixth aspect of the invention includes: (g) forming a source electrode and a drain electrode on a substrate; (h) forming a semiconductor layer on the source electrode and the drain electrode; (i) forming a gate electrode on the semiconductor layer with a gate insulation film interposed between the gate electrode and the semiconductor layer; and (j) forming a pixel electrode so as to be coupled to the drain electrode. The method for forming a film pattern according to the first aspect of the invention may be used in at least one of steps (g), (i), and (j).

A method for manufacturing an active matrix substrate according to a seventh aspect of the invention includes: (k) forming a semiconductor layer on a substrate; (l) forming a gate electrode on the semiconductor layer with a gate insulation film interposed between the gate electrode and the semiconductor layer; (m) forming a source electrode so as to be coupled to a source region of the semiconductor layer through a first contact hole formed in the gate insulation film, and a drain electrode so as to be coupled to a drain region of the semiconductor layer through a second contact hole formed in the gate insulation film; and (n) forming a pixel electrode so as to be coupled to the drain electrode. The method for forming a film pattern according to the first aspect of the invention may be used in at least one of steps (l), (m), and (n).

Accordingly, in the method for manufacturing an active matrix substrate according to the fifth, sixth and seventh aspects of the invention, the electrodes are formed by employing the method for forming a film pattern described above, reducing the manufacturing cost.

BRIEF DESCRIPTION OF THE DRAWINGS

The invention will be described with reference to the accompanying drawings, wherein like numbers reference like elements.

FIG. 3A is a plan view illustrating a bank structure while

FIGS. 5A through 8E are sectional views describing steps to form a pixel.

DESCRIPTION OF EXEMPLARY EMBODIMENTS

Figure 1:
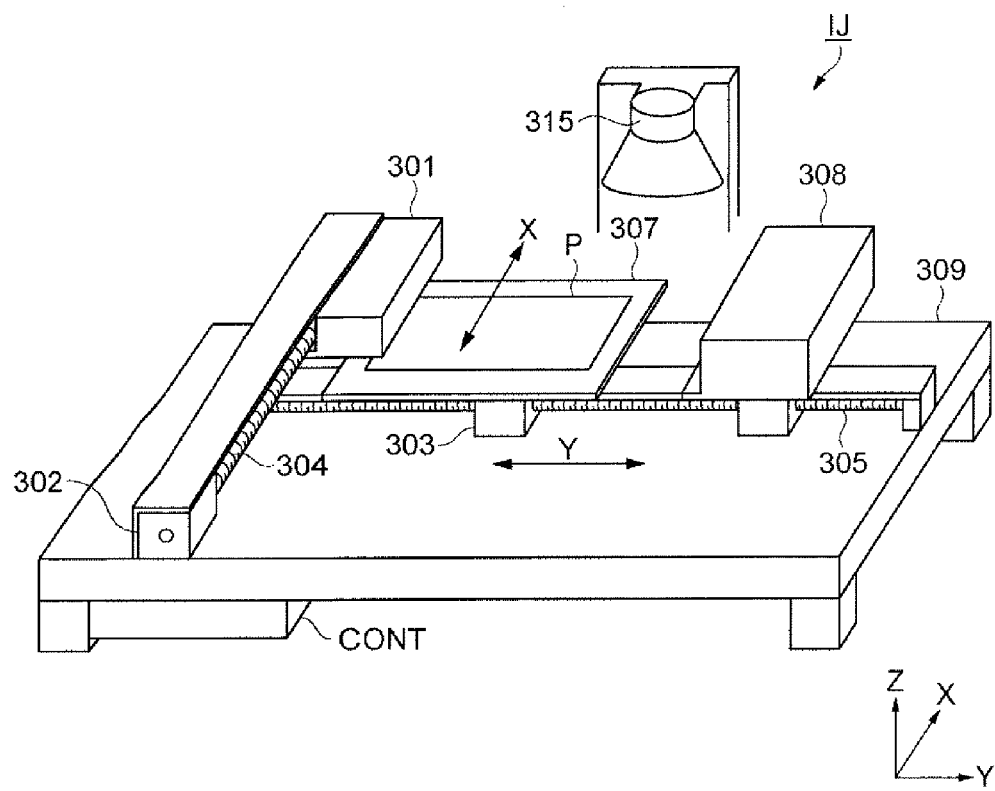
FIG. 1 is a perspective view illustrating a schematic structure of a droplet discharge device.

Embodiments of a method for forming a film pattern, a method for manufacturing an active matrix substrate, a device, an electro-optical device, and an electronic apparatus according to the invention, will be described below with reference to FIGS. 1 through 15.

The embodiments described below are shown by way of example, and not intended to limit the invention. It should be noted that different scales are used for the layers and members in the drawings, so that the layers and members can be recognized.

[Droplet Discharge Device]

First, a droplet discharge device, which is used to form a film pattern in a first embodiment, will be described with reference to FIG. 1.

FIG. 1 is a perspective view illustrating a schematic structure of a droplet discharge device (inkjet device) IJ that disposes a functional liquid on a substrate by a droplet discharge method as an example of devices used for the method for forming a film pattern according to the invention.

The droplet discharge device IJ includes a droplet discharge head 301, an X-axis direction drive axis 304, a Y-axis direction guide axis 305, a controller CONT, a stage 307, a cleaning mechanism 308, a base 309, and a heater 315.

The stage 307, which supports a substrate P to which ink (a liquid material) is provided by the droplet discharge device IJ, includes a fixing mechanism (not shown) for fixing the substrate P to a reference position. In the embodiment, the stage 307 supports a substrate 18, which will be described later.

The droplet discharge head 301 is a multi-nozzle type droplet discharge head including a plurality of discharge nozzles. The longitudinal direction of the head 301 coincides with the X-axis direction. The plurality of discharge nozzles are disposed on a lower surface of the droplet discharge head 301 in the X-axis direction by a constant interval. The ink (functional liquid) containing conductive fine particles is discharged from the discharge nozzles included in the droplet discharge head 301 to the substrate P supported by the stage 307.

The X-axis direction drive axis 304 is connected to an X-axis direction drive motor 302. The X-axis direction drive motor 302 is a stepping motor, for example, and rotates the X-axis direction drive axis 304 when the controller CONT supplies a driving signal in the X-axis direction. The X-axis direction drive axis 304 rotates so as to move the droplet discharge head 301 in the X-axis direction.

The Y-axis direction guide axis 305 is fixed so as not to move with respect to the base 309. The stage 307 is equipped with a Y-axis direction drive motor 303. The Y-axis direction drive motor 303 is a stepping motor, for example, and moves the stage 307 in the Y-axis direction when the controller CONT supplies the motor 303 with a driving signal for Y-axis direction.

The controller CONT supplies the droplet discharge head 301 with a voltage for controlling a droplet discharge. The controller CONT also supplies the X-axis direction drive motor 302 with a drive pulse signal for controlling the movement of the droplet discharge head 301 in the X-axis direction, and the Y-axis direction drive motor 303 with a drive pulse signal for controlling the movement of the stage 307 in the Y-axis direction.

The cleaning mechanism 308 cleans the droplet discharge head 301. The cleaning mechanism 308 is equipped with a drive motor (not shown) for Y-axis direction. By driving the Y-axis direction drive motor, the cleaning mechanism 308 is moved along the Y-axis direction guide axis 305. The controller CONT also controls the movement of the cleaning mechanism 308.

The heater 315, which is means to subject the substrate P under a heat treatment by a lamp annealing in this case, evaporates and dries solvents contained in a liquid material coated on the substrate P. The controller CONT also controls turning on and off of the heater 315.

The droplet discharge device IJ discharges droplets to the substrate P while relatively scanning the droplet discharge head 301 and the stage 307 supporting the substrate P. In the following description, the Y-axis direction is referred to as a scan direction and the X-axis direction perpendicular to the Y-axis direction is referred to as a non-scan direction. Therefore, the discharge nozzles of the droplet discharge head 301 are disposed at a constant interval in the X-axis direction, which is the non-scan direction. While the droplet discharge head 301 is disposed at right angle to the moving direction of the substrate P in FIG. 1, the angle of the droplet discharge head 301 may be adjusted so as to intersect the moving direction of the substrate P. Accordingly, a pitch between the nozzles can be adjusted by adjusting the angle of the droplet discharge head 301. Alternatively, the distance between the substrate P and a nozzle surface may be made to be arbitrarily adjustable.

Figure 2:
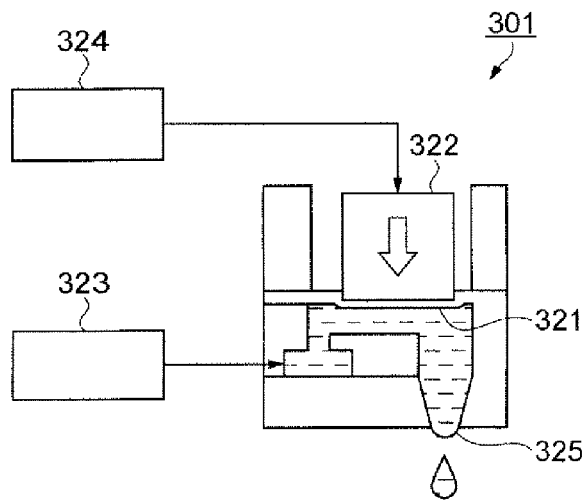
FIG. 2 is a view describing a discharge principle of a liquid by a piezoelectric method.

FIG. 2 is a diagram for explaining a discharge principal of a liquid material by a piezoelectric method.

In FIG. 2, a piezo element 322 is disposed adjacent to a liquid chamber 312 storing a liquid material (ink for wiring pattern or functional liquid). To the liquid chamber 312, a liquid material is supplied through a liquid material supply system 323 including a material tank that stores the liquid material.

The piezo element 322 is connected to a driving circuit 324. A voltage is applied to the piezo element 322 through the driving circuit 324 so as to deform the piezo element 322, thereby the liquid chamber 312 is deformed to discharge the liquid material from a nozzle 325. In this case, a strain amount of the piezo element 322 is controlled by changing a value of applied voltage. In addition, a strain velocity of the piezo element 322 is controlled by changing a frequency of applied voltage.

Here, various techniques, which are known as a principle to discharge a liquid material in related art, can be applied in addition to the piezoelectric method in which ink is discharged by using the piezoelectric method of a piezo element. The techniques include a bubble method in which a liquid material is discharged by bubbles generated by heating the liquid material, and the like. Among these, the piezoelectric method has an advantage of not giving influence to a composition of a liquid material or the like because no heat is applied to the liquid material.

Here, a functional liquid L1 (refer to FIGS. 5A through 5C) includes a dispersion liquid in which conductive fine particles, organic silver compounds, or nanoparticles of silver oxide are dispersed in a dispersion medium.

For the conductive fine particles, for example, metal fine particles including any of Au, Ag, Cu, Pd, Mn, Cr, Co, In, Sn, ZnBi, and Ni, their oxides, alloys, intermetallics, organic salts, organometallic compounds, and fine particles of a conductive polymer or a super-conductive material or the like are employed.

These conductive fine particles may be used by coating their surfaces with an organic matter or the like to improve their dispersibility.

The diameter of the conductive fine particle is preferably in the range from 1 nm to 0.1 μm. Particles whose diameter is larger than 0.1 μm may cause clogging of the discharge nozzle included in the droplet discharge head, while particles having a diameter smaller than 1 nm may make the volume ratio of a coated material to the particles so large that the ratio of an organic matter in the resulting film becomes excessive.

Here, any dispersion medium can be used as long as it is capable of dispersing the above-described conductive fine particles and does not cause an aggregation. Examples of the medium can include: water; alcohols such as methanol, ethanol, propanol, and butanol; hydrocarbon compounds such as n-heptane, n-octane, decane, dodecane, tetradecane, toluene, xylene, cymene, durene, indene, dipentene, tetrahydronaphthalene, decahydronaphthalene, and cyclohexylbenzene; ether compounds such as ethylene glycol dimethyl ether, ethylene glycol diethyl ether, ethylene glycol methyl ethyl ether, diethylene glycol dimethyl ether, diethylene glycol diethyl ether, diethylene glycol methyl methyl ether, 1,2-dimethoxyethane, bis(2-methoxyethyl) ether, and p-dioxane; and polar compounds such as propylene carbonate, gamma-butyrolactone, N-methyl-2-pyrrolidone, dimethylformamide, dimethyl sulfoxide, and cyclohexanone. Water, the alcohols, the carbon hydride series compounds, and the ether series compounds are preferable for the dispersion medium, water and the carbon hydride series compounds are much preferred from the following points of view: a dispersion of the fine particles, stability of a dispersion liquid, and an ease of the application for the droplet discharge method (inkjet method).

The surface tension of the dispersion liquid of the conductive fine particles is preferably within the range from 0.02 N/m to 0.07 N/m inclusive. If the surface tension is below 0.02 N/m when the liquid is discharged by using the droplet discharge method, the wettability of the ink composition with respect to a surface of the discharge nozzle is increased, easily causing a flight curve, while if the surface tension exceeds 0.07 N/m, a meniscus shape at the tip of the nozzle is unstable, rendering the control of the discharge amount and discharge timing problematic. To adjust the surface tension, a fluorine-, silicone- or nonionic-based surface tension adjuster, for example, may be added in a small amount to the dispersion liquid in a range not largely lowering a contact angle with respect to a substrate. The nonionic surface tension adjuster enhances the wettability of a liquid with respect to a substrate, improves the leveling property of a film, and serves to prevent minute concavities and convexities of the film from being generated. The surface tension adjuster may include, as necessary, organic compounds, such as alcohol, ether, ester, and ketone.

The viscosity of the disperse liquid is preferably within the range from 1 mPa·s to 50 mPa·s inclusive. When a liquid material is discharged as a droplet by using a droplet discharge method, ink having a viscosity lower than 1 mPa·s may contaminate the periphery of the nozzle due to ink leakage. Ink having a viscosity higher than 50 mPa·s may possibly cause nozzle clogging, making it difficult to discharge droplets smoothly.

[Bank Structure]

Next, a bank structure, which controls the position of a functional liquid (ink) on a substrate in the embodiment, will be described with reference to FIGS. 3A and 3B.

Figure 3A:
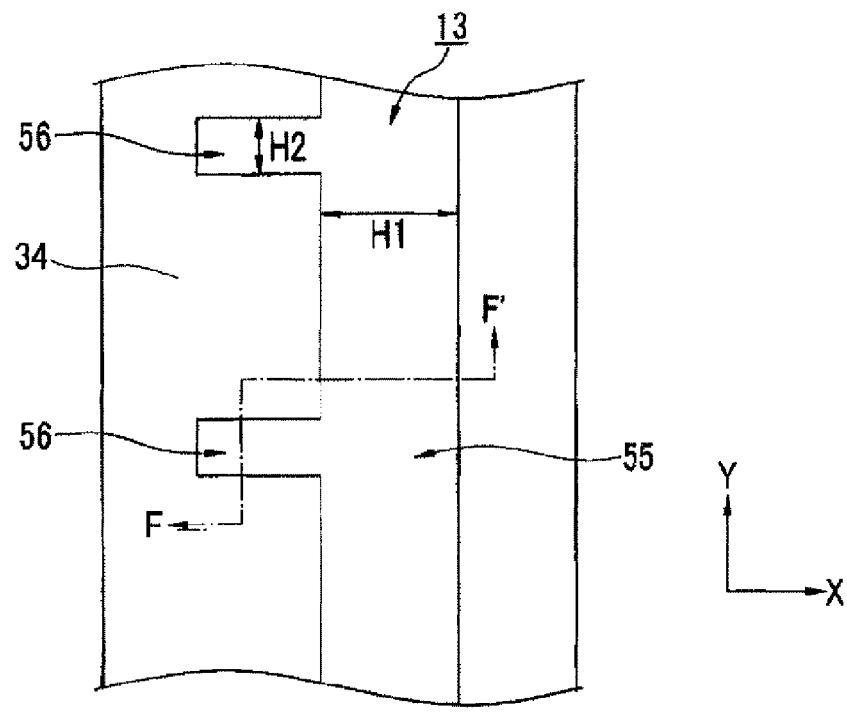

FIG. 3A is a plan view illustrating a schematic structure of the bank structure. FIG. 3B is a sectional view illustrating the bank structure taken along the line F-F' in FIG. 3A.

Figure 3B:
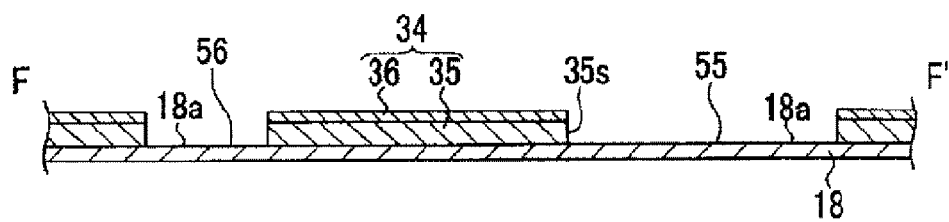
FIG. 3B is a sectional view of FIG. 3A.

As shown in FIGS. 3A and 3B, the bank structure of the embodiment is structured so that a bank 34 is formed on the substrate 18. A region partitioned by the bank 34 is a pattern forming region 13, in which a functional liquid is disposed. The pattern forming region 13 of the embodiment is provided on the substrate 18, to which a gate wiring line and a gate electrode are formed so as to structure a TFT, as described later.

The pattern forming region 13 includes a first pattern forming region 55 and a second pattern forming region 56 connected to the region 55, both of which have a groove shape in section. The region 55 corresponds to a gate wiring line (film pattern), while the region 56 corresponds to a gate electrode (film pattern). Here, "correspond" means the following: a functional liquid disposed in the region 55 or the region 56 turns a gate wiring line or a gate electrode respectively by a hardening treatment or the like.

Specifically, as shown in FIG. 3A, the region 55 is formed so as to extend in the Y-axis direction. The region 56 is formed so as to be about perpendicular to the region 55 (in the X-axis direction in FIG. 3A), and be continuously connected to the region 55.

In addition, the width of the region 55 is wider than that of the region 56. In this embodiment, the width of the region 55 is formed so that it is nearly equal to, or slightly larger than a diameter of a flying functional liquid droplet discharged from the droplet discharge device IJ. Employing such bank structure allows a functional liquid discharged in the region 55 to flow into the region 56, which is a fine pattern, by utilizing a capillary phenomenon.

The width of the region 55 is expressed by the length between end parts of the region 55 in the direction perpendicular to the direction in which the region 55 extends (in the Y direction). Likewise, the width of the region 56 is expressed by the length between end parts of the region 56 in the direction perpendicular to the direction in which the region 56 extends (in the X direction). Namely, as shown in FIG. 3A, the width of the region 55 is expressed by a length H1, while the width of the region 56 is expressed by a length H2.

On the other hand, a section (F-F' section) of the bank structure has a structure shown in FIG. 3B. Specifically, the bank 34 having a multilayered structure is disposed on the substrate 18. In the embodiment, the bank 34 has a two-layer structure of a first bank layer 35 and a second bank layer 36 covering the first bank layer 35, which are layered in this order from the substrate 18. In addition, the second bank layer 36, which is the upper layer in the bank 34, has higher lyophobicity than the first bank layer 35, while the first bank layer 35, which is the lower layer in the bank 34, has relatively higher lyophilicity than the second bank layer 36. Accordingly, in the embodiment, even if a functional liquid is landed on the upper surface of the bank 34, the functional liquid flows into the regions 55 and 56 (mainly into the region 55) since the upper surface has lyophobicity. As a result, the functional liquid adequately flows in the regions 55 and 56.

[Method for Forming a Film Pattern]

Next, a method for forming the bank structure in the embodiment, and a method for forming a gate wiring line as a film pattern on the pattern forming region 13, which is partitioned by the bank structure, will be described.

FIGS. 4A through 4D are sectional views sequentially illustrating steps to form the bank structure. Namely, FIGS. 4A through 4D are diagrams illustrating steps to form the pattern forming region 13 including the first pattern forming region 55 and the second pattern forming region 56 based on the sectional view taken along the line F-F' in FIG. 3A. FIGS. 5A through 5C are sectional views describing a process for forming a film pattern (gate wiring line) by disposing a functional liquid to the bank structure formed in the manufacturing steps shown in FIGS. 4A through 4D.

[Bank Material Coating Step]

First, the substrate 18 is subjected to HMDS treatment as surface modification treatment prior to the application of a bank material. The HMDS treatment is to apply hexamethyldisilazane $((CH_3)_3SiNHSi(CH_3)_3)$ in vapor to a surface of an object (for 120 sec, for example) and dry (at 95 degrees centigrade for 60 sec, for example). This treatment provides an HMDS layer (not shown) on the substrate 18. The layer serves as an adhesion layer increasing adhesiveness between a bank and the substrate 18.

As the substrate 18, materials such as glass, quartz glass, a Si wafer, a plastic film, a metal plate can be used. On a surface of the substrate 18, a lower layer such as a semiconductor film, a metal film, a dielectric film and an organic film may be formed.

Figure 4A:
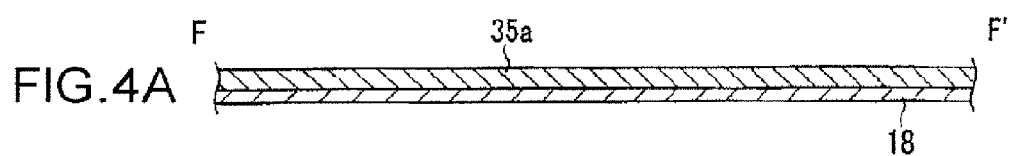
FIGS. 4A through 4D are sectional views illustrating steps to form the bank structure.
Figure 4B:
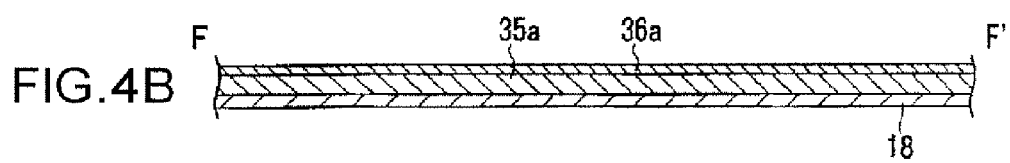
Figure 5A:
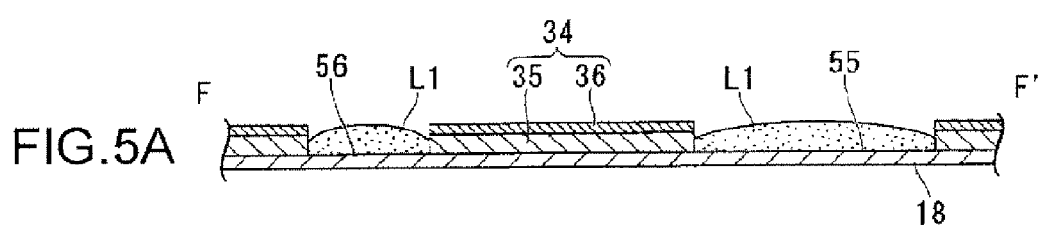
FIGS. 5A through 5C are sectional views describing steps to form a wiring pattern.
Figure 5B:
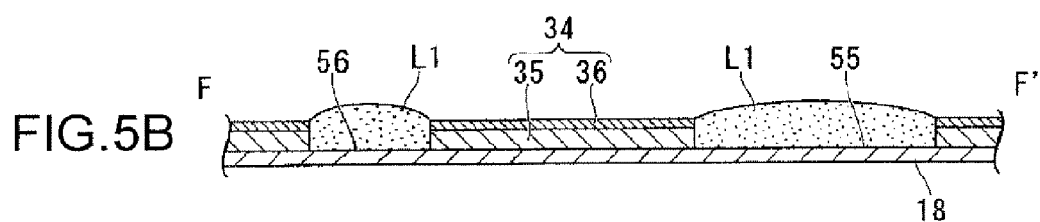
Figure 5C:
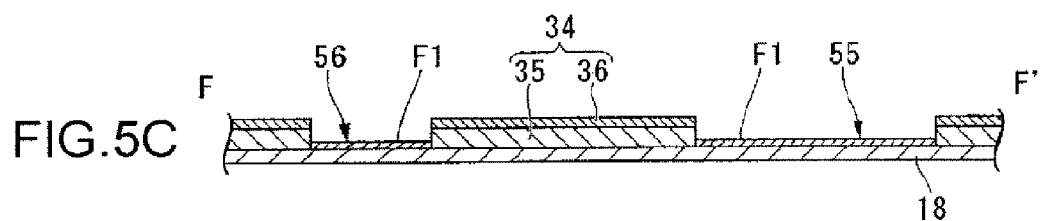

Then, on the HMDS layer formed as above, a first bank forming material is coated on the entire surface of the substrate 18 by spin coating and prebaked so as to form a pre-first bank layer 35a (drying condition; at 95 degrees centigrade for 60 seconds) as shown in FIG. 4A. Then, a second bank forming material is coated on the first bank forming material 35a and prebaked so as to form a pre-second bank layer 36a (drying condition; at 95 degrees centigrade for 60 seconds) as shown in FIG. 4B. In this case, various methods such as spray coating, roll coating, die coating, dip coating, and an inkjet method can be applied as the coating method of the bank forming materials.

As the first bank forming material, an insulating organic material (photosensitive organic material) that is easy to pattern by photolithography, for example, a polymer material such as acrylic resins, polyimide resins, olefin resins, melamine resins, and phenol resins can be used.

As the second bank forming material, a fluororesin material (PVDF, PTFE) such as EGC-1700 or EGC-1720 (diluted 2:1) manufactured by Sumitomo 3M Ltd can be used, for example.

However, if the thickness of the pre-second bank layer 36a exceeds 1 μm, failure in pattern forming may likely occur in a development step. The thickness of the pre-second bank layer 36a is preferably 500 nm or below, specifically, around from 50 nm to 100 nm, for example. As a solvent of the pre-second bank layer 36a, for example, hydrofluoroether that is hard to dissolve the first bank layer can be used.

Using these materials enables the surface of the pre-second bank layer 36a to have favorable lyophobicity, keeping the functional liquid disposed in the pattern forming region 13. Further, droplets of the functional liquid landed on out of the pattern forming region 13 can flow into the pattern forming region 13 because of lyophobicity of the second bank layer 36. As a result, a film pattern having an accurate planer shape and thickness is formed.

[Exposure Step]

Figure 4C:
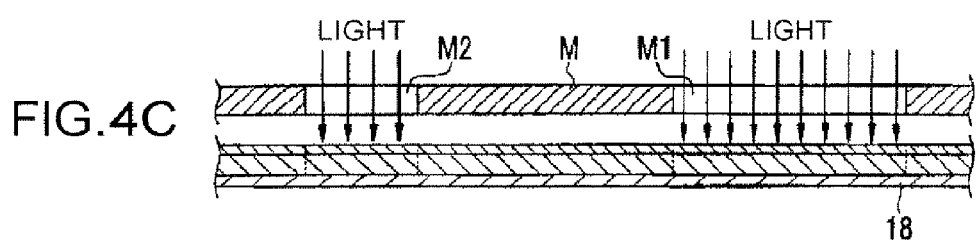

Next, as shown in FIG. 4C, the pre-bank layers 35a and 36a formed on the substrate 18 are irradiated by light from an exposure device (not shown) through a mask M so as to form the first pattern forming region 55 and the second pattern forming region 56. In this step, the pre-bank layers 35a and 36a, which are exposed by the irradiation of light, are turned into a state that they can be dissolved and removed in the development step described later. As a result, the bank structure having the pattern forming region 13 described above is formed.

[Development Step]

Figure 4D:
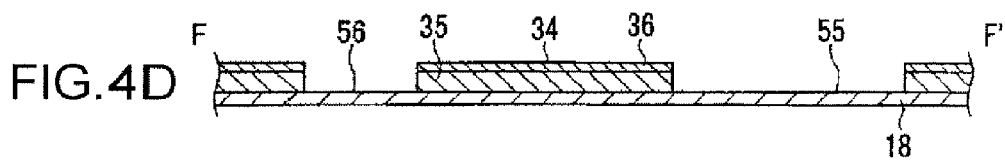

After the exposure step described above, as shown in FIG. 4D, the pre-bank layers 35a and 36a, which are irradiated by light, are developed wth tetramethyl ammonium hydroxide (TMAH) in a condition such as with 2.38% TMAH at 26 degrees centigrade for 40 sec, for example, and a part exposed to light is selectively removed. As a result, the bank 34, which defines the pattern forming region 13 including the second pattern forming region 56 and the first pattern forming region 55, is formed on the substrate 18 as shown in FIG. 4D.

[Functional Liquid Disposition Step]

Next, a step to form a gate wiring line (film pattern) will be described. In the step, a functional liquid is discharged and disposed in the pattern forming region 13, which is formed by the bank structure achieved in the above-described steps, by using the droplet discharge device IJ. Here, it is hard to directly dispose the functional liquid to the second pattern forming region 56 as it is a fine wiring pattern. Therefore, the functional liquid is disposed in the region 56 by flowing the functional liquid disposed to the region 55 by a capillary phenomenon described above.

Figure 6A:
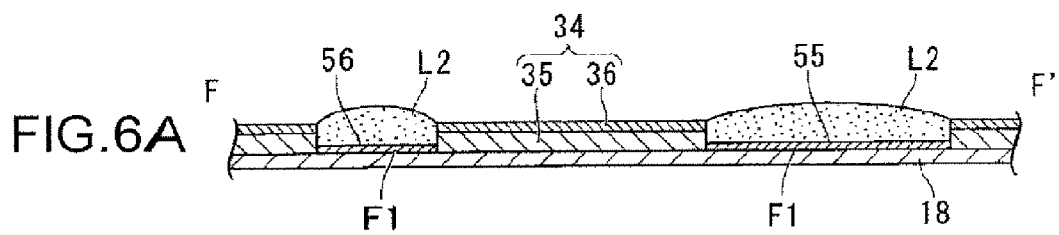
FIGS. 6A through 6D are sectional views describing steps to form a wiring pattern.
Figure 6B:
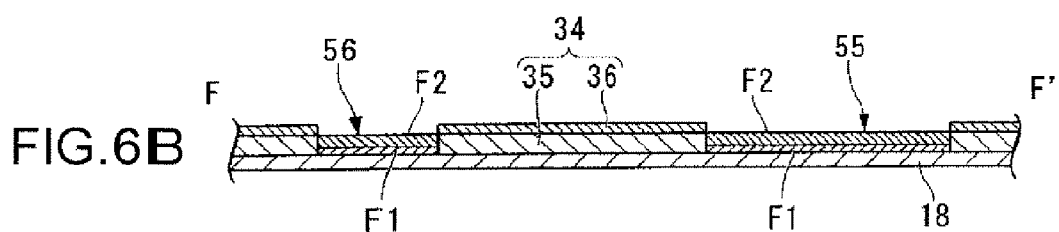
Figure 6C:
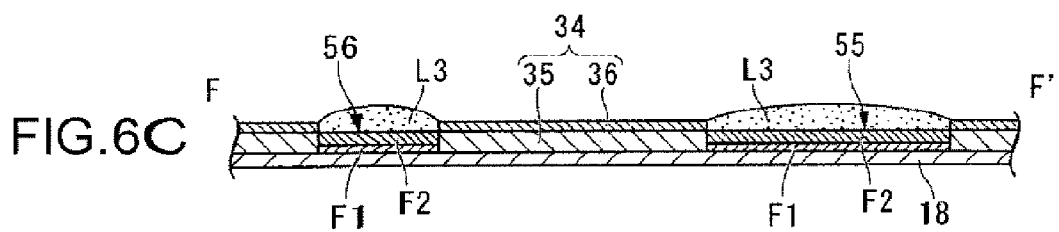
Figure 6D:
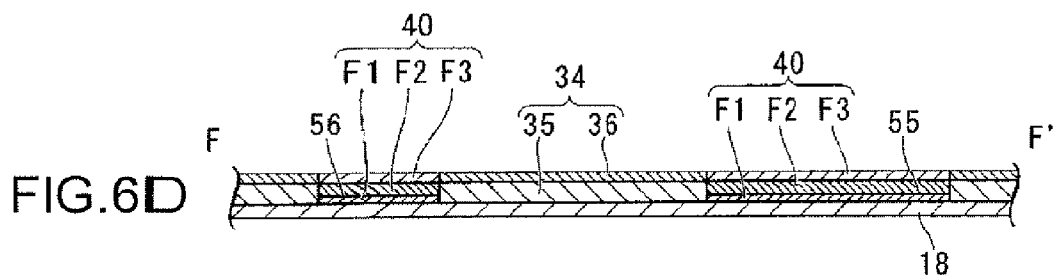

Further, in the embodiment, the wiring pattern is formed so that a gate wiring has a three-layer structure as shown in FIG. 6D.

Specifically, the gate wiring in the embodiment is formed with three layers which are a manganese layer (base layer) F1, a silver layer (conductive layer) F2, and a nickel layer (protective layer) F3 in this order from the lowest layer.

In the wiring formed as described above, the manganese layer F1 serves as a base layer to improve adhesiveness of the silver layer F2, while the nickel layer F3 serves as a protective film. The protective film serves as a diffusion preventing layer of a conductive film made of Ag, copper, or the like.

As the material to form the base layer F1, an oxide of Ti, Cu, Ni, In, or Cr can be used other than manganese.

Further, as the material to form the protective layer FS, a metal material made of Ti, W, Mn or the like other than nickel. They may be used singly or in combination as the metal material.

First, a functional liquid (first functional liquid) L1 having manganese (Mn) dispersed as conductive fine particles in an organic dispersion medium to form the manganese layer F1 is discharged in the first pattern forming region 55 with the droplet discharge device IJ. The functional liquid L1 disposed to the region 55 by the droplet discharge device IJ wets and spreads in the region 55. Even if the functional liquid L1 is disposed on the upper surface of the bank 34, the functional liquid L1 is repelled and flows into the region 55 since the upper surface has lyophobicity.

In contrast, the functional liquid L1, which is discharged and disposed, adequately flows in the entire area of the pattern forming region 13 since the inside surface of the bank 34 (inside surface of the first bank layer 35) shows a higher lyophilicity than its upper surface. As shown in FIGS. 5A through 5C, the functional liquid L1 uniformly spreads in the regions 55 and 56.

After the functional liquid L1 is discharged on the substrate 18, the functional liquid L1 (manganese layer F1) and the bank 34 are dried and fired at once in order to remove the dispersion medium (organic material) and solidify the bank 34. The drying and firing treatments secure an electrical contact between conductive fine particles, the functional liquid L1 disposed turns to a conductive film.

As the drying treatment, heating treatment using a typical hot plate, electric furnace, or the like to heat the substrate P may be employed, for example. The drying treatment is mainly to reduce unevenness of film thickness and performed by heating at 120 degrees centigrade for two minutes.

The processing temperature for the firing treatment is determined at an appropriate level, taking into account the boiling point (vapor pressure) of the dispersion medium, dispersibility of fine particles, thermal behavioral properties such as oxidizability of fine particles, the presence and volume of a coating material, and the heat resistance temperature of a base material, or the like. For example, eliminating a coating material made of an organic matter requires firing at about 220 degrees centigrade for 30 minutes.

Accordingly, the dried manganese film (first dried film) after the drying treatment is formed on the regions 55 and 56 as the manganese layer F1 as shown in FIG. 5C.

Here, the thickness of the manganese layer (dried film) F1 is formed thinner than that of the first bank layer 35.

Then, in order to form the silver layer F2, a functional liquid L2 (second functional liquid) in droplets is disposed in the regions 55 and 56 in which the manganese layer F1 is formed as shown in FIG. 6A. In the functional liquid L2, nanoparticles of silver (Ag) serving as conductive fine particles are dispersed in an organic dispersion medium. To the functional liquid L2, a dispersion stabilizing agent of an amino compound is added other than the nanoparticles of Ag, for example.

Here, since the manganese layer F1 is formed thinner than the first bank layer 35, the functional liquid L2 applied on the manganese layer F1 comes in contact with the first bank layer 35 having lyophilicity rather than the second bank layer 36. Therefore, the functional liquid L2 can wet and spread well.

In addition, the functional liquid applied on the manganese layer F1 is dried and fired to remove the dispersion medium and the dispersion stabilizing agent.

The firing treatment (heat treatment) for the functional liquid including silver fine particles and the dispersion stabilizing agent is performed in a nitrogen atmosphere at about 220 degrees centigrade for 30 minutes so as to remove the dispersion medium (and the dispersion stabilizing agent). Ag has a property in which a particle grows by heating in an atmosphere with oxygen. However, in the embodiment, the firing treatment is performed in a nitrogen atmosphere, preventing the particle from growing.

The firing treatment secures an electric contact between silver fine particles, and the functional liquid L2 is converted into the silver layer F2 serving as a conductive film.

Subsequently, to form the nickel layer F3, a functional liquid L3 in droplets, which is made of an organic dispersion medium having nickel dispersed as a conductive fine particle, is disposed on the silver layer F2. Then, the functional liquid disposed is dried and fired to remove the dispersion medium. In this treatment, drying treatment at about 70 degrees centigrade for 10 minutes is performed first to prevent unevenness caused by drying, and then firing treatment is performed in a nitrogen atmosphere at about 300 degrees centigrade for 30 minutes.

Through the dry and firing treatment, the nickel layer F3 is formed as a protective layer by being layered on the silver layer F2. A gate wiring line (film pattern) 40 and a gate electrode (film pattern) 41 that are formed with the manganese layer F1, the silver layer F2, and the nickel layer F3 are formed as shown in FIG. 6D.

As described above, in the method for forming a film pattern according to the embodiment, the functional liquids L1 through L3 are adequately kept in the pattern forming region 13 by the second bank layer 36 having lyophobicity. Further, the manufacturing cost is reduced by using an organic material that is less expensive than an inorganic material to form the first bank layer 35. Furthermore, in the embodiment, these first bank layer 35 and second bank layer 36 are formed in the same step (spin coating), also improving productivity.

Here, since the thickness of the manganese layer F1 is formed thinner than that of the first bank layer 35, the functional liquid L2 to be applied to form the silver layer F2 also comes in contact with the first bank layer 35. Since the first bank layer 35 has lyophilicity more than the second bank layer 36, the sidewall of the first bank layer 35 can assist the functional liquid L2 to be wet and spread well. In particular, in the embodiment, since the second bank layer 36 is formed thinner than the first bank layer 35, a large volume of a functional liquid can be disposed in the pattern forming region, thereby a film pattern having a relatively thick thickness can be easily and uniformly formed.

Further, since the manganese layer F1 and the bank 34 are fired at once, a step that takes time to heat up to a high temperature is omitted in the embodiment, thereby manufacturing efficiency can be increased.

[Device]

Next, a device according to a second embodiment of the invention will be described. The device has a film pattern formed by the method for forming a film pattern according to the first embodiment. In this embodiment, a pixel (device) having a gate wiring line, and a method for forming the pixel will be described with reference to FIGS. 7 and 8.

In the embodiment, a pixel, which includes a gate electrode, a source electrode, a drain electrode, and the like of a TFT 30 of a bottom gate type, is formed by using the above-described methods for forming a bank structure and a film pattern. In the following description, the description of the same steps in the film pattern forming process shown in FIGS. 5 and 6 will be omitted. The structural element the same as that in the first embodiment is given the same numeral.

[Structure of a Pixel]

First, the structure of a pixel (device) having a film pattern formed by the above-described method for forming a film pattern will be described.

Figure 7:
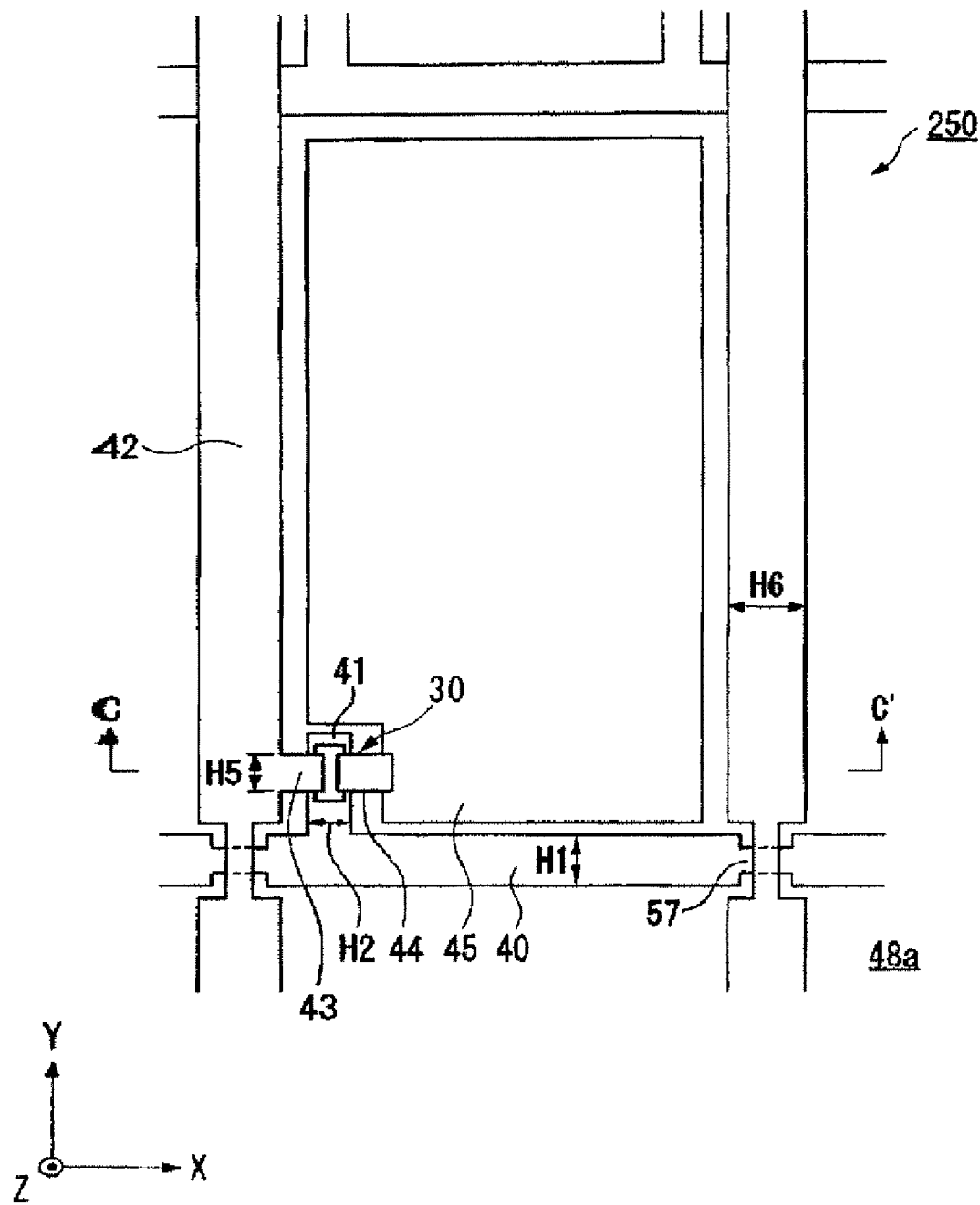
FIG. 7 is a plan view illustrating a pixel serving as a display area.

FIG. 7 shows a pixel structure 250 of the embodiment.

As shown in FIG. 7, the pixel structure 250 is provided, on a substrate, with the gate wiring line 40, the gate electrode 41 formed so as to be extended from the gate wiring line 40, a source wiring line 42, a source electrode 43 formed so as to be extended from the source wiring line 42, a drain electrode 44, and a pixel electrode 45 electrically connected to the drain electrode 44. The gate wiring line 40 is formed so as to extend in the X-axis direction, while the source wiring line 42, which intersects the gate wiring line 40, is formed so as to extend in the Y-axis direction. In the vicinity of the intersection of the gate wiring line 40 and the source wiring line 42, the TFT 30, which is a switching element, is formed. By turning on the TFT 30, a drive current is supplied to the pixel electrode 45 connected to the TFT 30.

As shown in FIG. 7, the width H2 of the gate electrode 41 is formed so as to be narrower than the width H1 of the gate wiring line 40. For example, the width H2 of the gate electrode 41 is 10 µm, while the width H1 of the gate wiring line 40 is 20 µm. The gate wiring line 40 and the gate electrode 41 are formed in the first embodiment.

Further, a width H5 of the source electrode 43 is formed so as to be narrower than a width H6 of the source wiring line 42. For example, the width H5 of the source electrode 43 is 10 µm, while the width HG of the source wiring line 42 is 20 µm. In the embodiment, a functional liquid flows into the source electrode 43, which is a fine pattern, by a capillary phenomenon by applying the method for forming a film pattern described above.

In addition, as shown in FIG. 7, a narrowed width part 57, which has a wiring line width narrower than that of other regions, is provided at a part of the gate wiring line 40. Likewise, a similar narrowed width part is also provided to a part, which intersects with the gate wiring line 40, of the source wiring line 42. As a result, capacitance is not stored at the intersection since each wiring of the gate wiring line 40 and the source wiring line 42 is formed narrow at their intersection.

[Method for Forming a Pixel]

FIGS. 8A through 8E are sectional views, which are taken along the line C-C' shown in FIG. 7, illustrating steps to form the pixel structure 250. The method for forming a film pattern according to the first embodiment of the invention can be employed to form a pixel electrode.

Figure 8A:
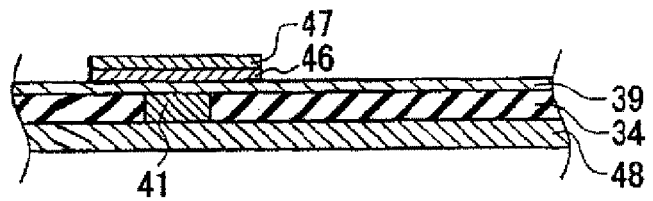

As shown in FIG. 8A, a gate insulation film 39 is formed on the surface of the bank 34 including the gate electrode 41 formed by the above-described method, by a plasma CVD or the like. Here, the gate insulation film 39 is made of silicon nitride. Then, an active layer is formed on the gate insulation layer 39. Subsequently, the active layer is patterned in a predetermined shape by photolithography and an etching, thereby an amorphous silicon film 46 is formed as shown in FIG. 5A.

Then, on the amorphous silicon film 46, a contact layer 47 is formed. Subsequently, the contact layer 47 is patterned in a predetermined shape by photolithography and an etching as shown in FIG. 8A. The contact layer 47 is formed as an n+ silicon film by changing raw material gas or plasma conditions.

Figure 8B:
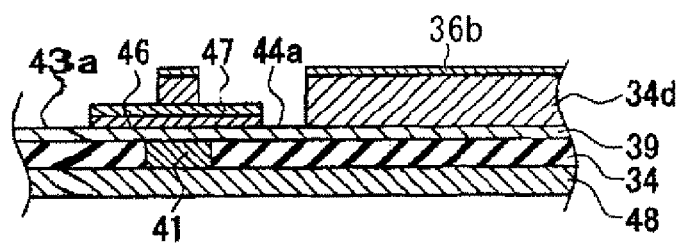

Then, as shown in FIG. 8B, a bank material is coated on the entire surface including the contact layer 47 by a spin coating method or the like, forming a first bank layer 34d. In this case, various methods such as spray coating, roll coating, die coating, dip coating, and an inkjet method can be applied as the coating method of the bank forming material. Here, as the material included in the bank material, a polymer material such as an acrylate resin, a polyimide resin, an olefin resin, or a melamine resin is used same as above since the material needs to have optical transparency and lyophobicity after a bank is formed. Further, on the bank material 34d, a second bank layer 36b is formed with a fluorine resin material having lyophobicity in the same manner as above.

Next, the bank 34d for a source-drain electrode, whose width is 1/20 to 1/10 of one pixel pitch, is formed. Specifically, a source electrode forming region 43a is formed by photolithography in a position corresponding to the source electrode 43 to be made of the bank forming material coated on the upper surface of the gate insulation film 39. Likewise, a drain electrode forming region 44a is formed in a position corresponding to the drain electrode 44. In a step to form a source-drain electrode using the first bank layer 34d and the second bank layer 36b, the method for forming a film pattern according to the first embodiment of the invention can be employed. Employing a structure in which the second bank layer 36b having lyophobicity against a functional liquid and the first bank layer 34d having lyophilicity more than the second bank layer 36b layered enables the functional liquid to wet and spread adequately, thereby a source electrode and drain electrode can be uniformly and homogeneously formed.

Then, a functional liquid L is disposed in the source electrode forming region 43a and the drain electrode forming region 44a formed by the bank 34d a for source-drain electrode so as to form the source electrode 43 and the drain electrode 44. Specifically, first, the functional liquid L is disposed in a region for forming a source wiring line by the droplet discharge device IJ. This process is not shown. The width H5 of the source electrode forming region 43a is formed so as to be narrower than the width H6 of the region for forming a source wiring line as shown in FIG. 7. Therefore, the functional liquid L disposed in the region for forming a source wiring line is transiently blocked by the narrowed width part provided to the source wiring line, flowing into the source electrode forming region 43a by a capillary phenomenon. As a result, as shown in FIG. 5C, the source electrode 43 is formed. Likewise, the drain electrode 44 is formed by discharging the functional liquid to the drain electrode forming region 44a.

Figure 8C:
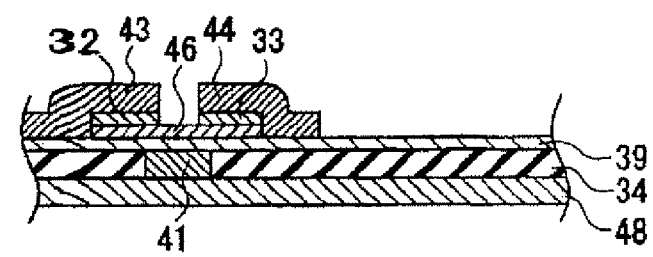

As shown in FIG. 8C, the bank 34d for a source-drain electrode (and the second bank layer 36b) is removed after forming the source electrode 43 and the drain electrode 44. Then, the n+ silicon film, which forms the contact layer 47, formed between the source electrode 43 and the drain electrode 44 is etched by using each of the source electrode 43 and the drain electrode 44 that remain on the contact layer 47 as a mask.

In the etching process, the n+ silicon film of the contact layer 47 formed between the source electrode 43 and the drain electrode 44 is removed. As a result, a part of the amorphous silicon film 46, which is formed under the n+ silicon film, is exposed. Consequently, a source region 32 made of n+ silicon is formed under the source electrode 43, while a drain region 33 made of n+ silicon is formed under the drain electrode 44.

Under the source region 32 and the drain region 33, a channel region made of the amorphous silicon (amorphous silicon film 46) is formed.

Through the above-described steps, the TFT 30 of a bottom gate type is achieved.

Figure 8D:
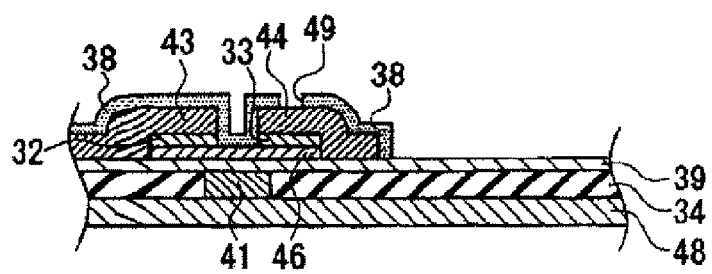

As shown in FIG. 8D, a passivation film 38 (protective film) is formed on the source electrode 43, the drain electrode 44, the source region 32, the drain region 33, and an exposed part of the amorphous silicon film 46 by vapor deposition, sputtering or the like. Subsequently, the passivation film 38 on the gate insulation film 39 on which the pixel electrode 45 to be described later will be formed is removed by photolithography and etching. At the same time, a contact hole 49 is formed in the passivation film 38 formed on the drain electrode 44 in order to electrically connect the pixel electrode 45 to the source electrode 43.

Figure 8E:
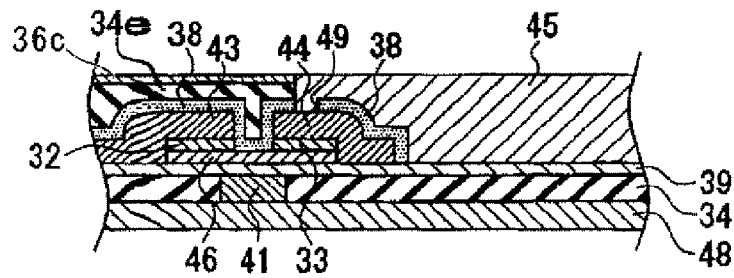

Then, as shown in FIG. 8E, a bank material is coated on the entire surface including the gate insulation film 39 on which the pixel electrode 45 is formed, forming a first bank layer 34e is formed. Here, the bank material includes a material such as an acrylate resin, a polyimide resin, or polysilazane as described above. Subsequently, on an upper surface of the first bank layer (pixel electrode bank) 34e, the second bank layer 36b is formed with a fluorine resin material having lyophobicity. Then, the pixel electrode bank 34e and a second bank layer 36c that partition a region for forming the pixel electrode 45 are patterned by photolithography.

Note that the pixel electrode bank 34e and the second bank layer 36c are also preferably provided with a bank in a layered structure used in the method for forming a film pattern according to the first embodiment of the invention.

Next, the pixel electrode 45 made of indium tin oxide (ITO) is formed in the region partitioned by the pixel electrode bank 34e (and the second bank layer 36c) by an ink-jet method, a vapor deposition method, or the like. In addition, the contact hole 49 is filled with the pixel electrode 45 so as to assure an electrical connection between the pixel electrode 45 and the drain electrode 44. In the embodiment, the second bank layer 36c having lyophobicity is formed on an upper surface of the pixel electrode bank 34e, while the region for forming a pixel electrode is treated to have lyophilicity. Accordingly, the pixel electrode 45 can be formed without running over the region for forming the pixel electrode.

Through the above-described steps, the pixel of the embodiment shown in FIG. 7 can be formed.

[Electro-Optical Device]

Next, a liquid crystal display will be described. The liquid crystal display is an example of an electro-optical device according to a third embodiment of the invention. The electro-optical device is provided with a pixel (device) formed by the above-described method for forming a film pattern with a bank structure.

Figure 9:
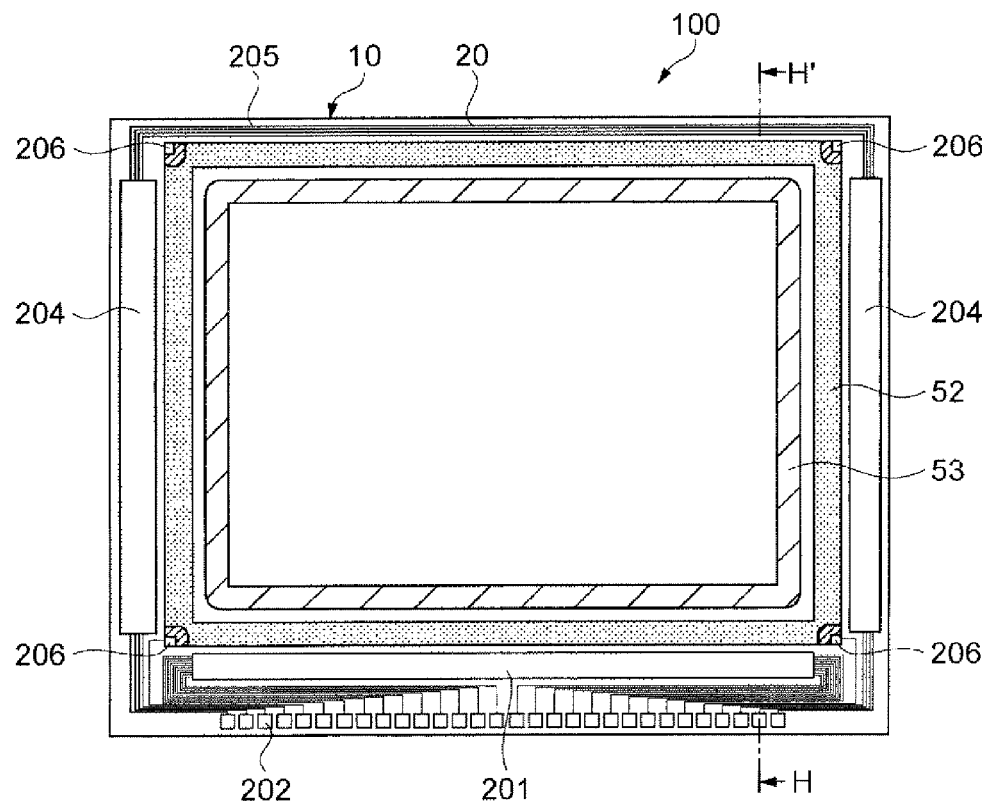
FIG. 9 is a plan view illustrating a liquid crystal display viewed from a counter substrate.
Figure 10:
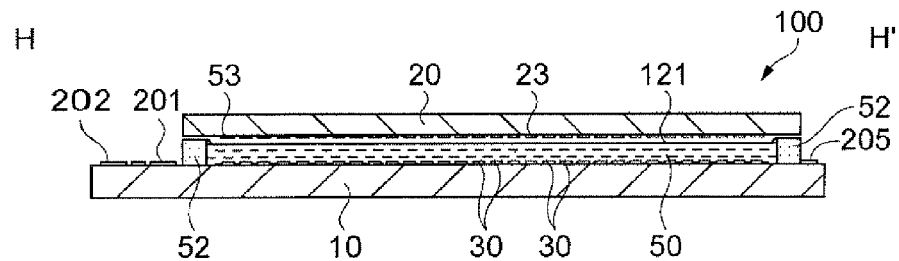
FIG. 10 is a sectional view of the liquid crystal display taken along the line H-H' in FIG. 9.
Figure 11:
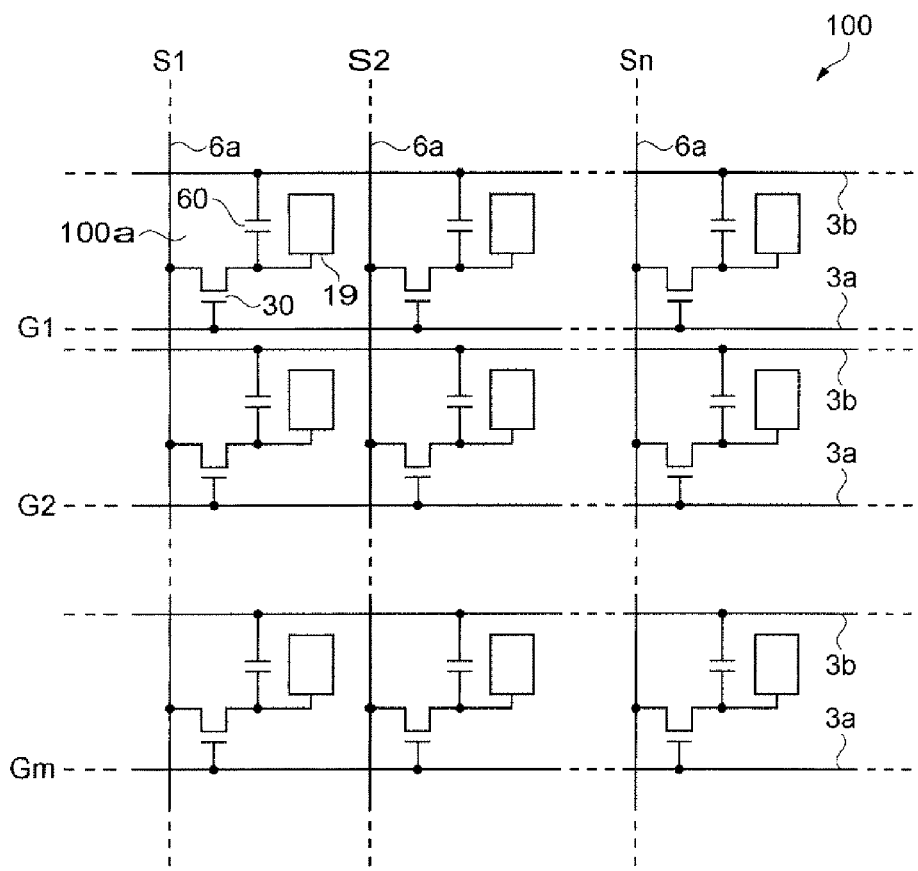
FIG. 11 is an equivalent circuit view of the liquid crystal display.

FIG. 9 is a plan view of a liquid crystal display according to the third embodiment. The plan view illustrates each element by viewing from a counter substrate side. FIG. 10 is a sectional view taken along the line H-H' in FIG. 9. FIG. 11 is an equivalent circuit diagram illustrating a plurality of pixels, which include various elements, wiring lines, or the like, formed in a matrix in an image display area of a liquid crystal display. Note that scales of layers and members in the drawings referred to hereinafter are adequately changed so that they are visible.

Referring to FIGS. 9 and 10, in a liquid crystal display (electro-optical device) 100 according to the embodiment, a TFT array substrate 10 and a counter substrate 20 are bonded as a pair with a photocuring sealant 52 interposed therebetween. In an area defined by the sealant 52, a liquid crystal 50 is sealed and retained.

In a region inside the area where the sealant 52 is provided, a peripheral light-blocking film 53 made of a light blocking material is provided. In an area outside the sealant 52, a data line driving circuit 201 and a mount terminal 202 are provided along one side of the TFT array substrate 10. Provided along two sides adjacent to the one side are scanning line driving circuits 204. Provided along another side of the TFT array substrate 10 are a plurality of wiring lines 205 to connect the scanning line driving circuits 204 provided to the both sides of an image display area. At one or more of the corners of the counter substrate 20, an inter-substrate conductive material 206 is disposed to provide electrical conductivity between the TFT array substrate 10 and the counter substrate 20.

Here, instead of providing the data line driving circuit 201 and the scanning line driving circuits 204 on the TFT array substrate 10, electrical and mechanical connection may be provided by a group of terminals and an anisotropic conductive film that are provided around a tape automated bonding (TAB) substrate on which a driving LSI is mounted and the TFT array substrate 10. Note that a retardation film, a polarizer, etc., included in the liquid crystal display 100 are disposed in a predetermined direction (not shown) depending on the type of the liquid crystal 50, i.e., operation modes including twisted nematic (TN), a C-TN method, a VA method, and an IPS method, and normally white mode or normally black mode.

If the liquid crystal display 100 is provided as a color display, red (R), green (G) and blue (B) color filters, for example, and their protective films are provided in an area in the counter substrate 20 facing to each pixel electrode in the TFT array substrate 10 that will be described below.

In the image display area of the liquid crystal display 100 of having the above-described structure, as shown in FIG. 11, a plurality of pixels 100a are arranged in a matrix. Each of the pixels 100a is provided with the TFT (switching element) 30 for switching a pixel. To the source of the TFT 30, a data line 6a that supplies pixel signals S1 through Sn is electrically coupled. The pixel signals S1 through Sn written in the data line 6a may be supplied line-sequentially in this order or in groups for a plurality of adjacent data lines each corresponding to the data line 6a. To the gate of the TFT 30, a scanning line 3a is electrically coupled. To the scanning line 3a, scanning signals G1 through Gm are applied pulsatively and line-sequentially in this order at a predetermined timing.

A pixel electrode 19 is electrically coupled to the drain of the TFT 30. The TFT 30, which is a switching element, is turned on for a certain period, and thereby the pixel signals S1 through Sn supplied from the data line 6a are written in each pixel at a predetermined timing. The pixel signals S1 through Sn, each of which is in a predetermined level and written in liquid crystal through the pixel electrode 19, are retained between a counter electrode 121 of the counter substrate 20 shown in FIG. 10 and the pixel electrode 45 for a certain period. In order to prevent a leak of the pixel signals S1 through Sn that are retained, a storage capacitor 60 is provided in parallel with a liquid crystal capacitance formed between the pixel electrode 19 and the counter electrode 121. For example, the voltage of the pixel electrode 19 is retained by the storage capacitor 60 for a period of time three orders of magnitude longer than the time for which a source electrode is applied. Consequently, an electron retention property increases, thereby the liquid crystal display 100 with a high contrast ratio can be provided.

Figure 12:
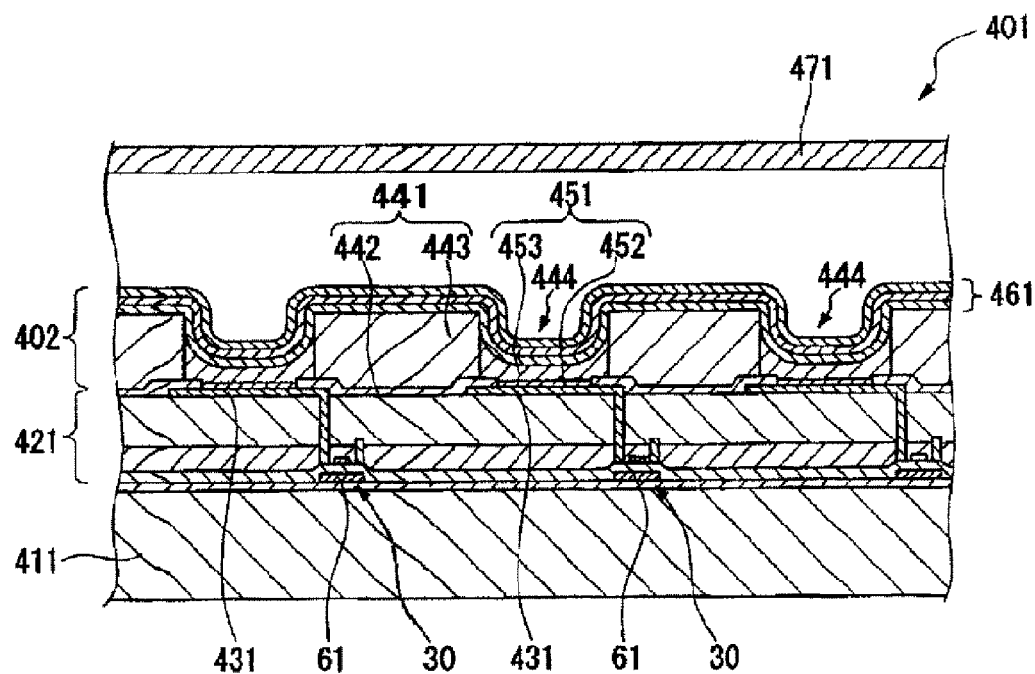
FIG. 12 is a partially enlarged sectional view of an organic EL device.

FIG. 12 is a sectional view illustrating an organic EL device provided with a pixel formed by the above-described method for forming a film pattern with a bank structure. The schematic structure of the organic EL device will be described below with reference to FIG. 12.

In FIG. 12, an organic EL device 401 is provided with an organic EL element 402, substrate 411, a circuit element part 421, a pixel electrode 431, and a sealing substrate 471, connected to a wiring line of a flexible substrate (not shown) and a driving IC (not shown). The organic EL element 402 includes a bank part 441, a light emitting element 451, and a cathode 461 (counter electrode). In the circuit element part 421, the TFT 30 serving as an active element is formed on the substrate 411. Arrayed on the circuit element part 421 is a plurality of pixel electrodes 431. A gate wiring line 61 included in the TFT 30, is formed by the method for forming a wiring pattern described in the first embodiment.

Between the respective pixel electrodes 431, the bank parts 441 are formed as a grid like. The light emitting element 451 is formed to a concave opening 444 resultingly formed by the bank part 441. The light emitting element 451 is provided with an element emitting red light, an element emitting green light, and an element emitting blue light so that the organic EL device 401 provides a full-color display. The cathode 461 is formed on the entire upper surface of the bank parts 441 and the light emitting elements 451, and on the cathode 461, the sealing substrate 471 is layered.

A manufacturing process of the organic EL device 401 having an organic EL element includes a bank part forming step to form the bank part 441, a plasma treatment step to adequately form the light emitting element 451, a light emitting element forming step to form the light emitting element 451, a counter electrode forming step to form the cathode 461, and a scaling step to place the sealing substrate 471 on the cathode 461 and seal it.

The light emitting element forming step includes a hole injection layer forming and a light emitting layer forming. In the step, the light emitting element 451 is formed by forming a hole injection layer 452 and a light emitting layer 453 on the pixel electrodes 431, which is located under the concave opening 444. The hole injection layer forming includes a first discharging and a first drying. In the first discharging, a liquid material to form the hole injection layer 452 is discharged on to each pixel electrode 431. In the first drying, the discharged liquid material is dried so as to form the hole injection layer 452. The light emitting layer forming includes a second discharging and a second drying. In the second discharging, a liquid material to form the light emitting layer 453 is discharged onto the hole injection layer 452. In the second drying, the discharged liquid material is dried so as to form the light emitting layer 453. As for the light emitting layer 453, three types of layers are formed with materials, each corresponding to respective three colors of red, green, and blue as described above. Therefore, the second discharging includes three steps, each discharging respective three types of materials.

In the light emitting element forming step, the droplet discharge device IJ can be used for the first discharging in the hole injection layer forming, and the second discharging in the light emitting layer forming. As a result, a uniform film pattern can be achieved even if a fine film pattern is included.

Since the electro-optical device according to this embodiment of the invention is provided with a device having highly accurate electrical characteristics, an electro-optical device having improved quality and performance can be achieved.

The electro-optical device according to the embodiment of the invention is also applicable to plasma display panels (PDPs) and surface-conduction electron emission elements that use a phenomenon of emitting electrons by passing an electrical current through in parallel with the surface of a thin film formed on a substrate with a small area other than the above.

[Electronic Apparatus]

Next, specific examples of an electronic apparatus of a fourth embodiment of the invention will be described.

Figure 13:
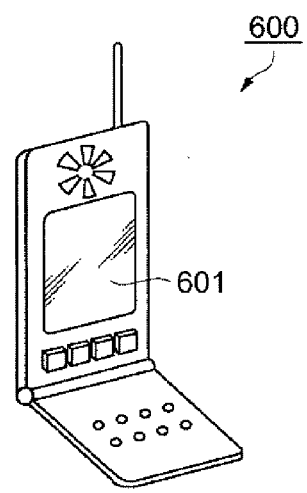
FIG. 13 shows an example of an electronic apparatus of the invention.

FIG. 13 is a perspective view illustrating an example of a cellular phone. In FIG. 13, a cellular phone body 600 is provided with a liquid crystal display 601 including the liquid crystal display in the third embodiment.

The electronic apparatus shown in FIG. 13 provides high quality and performance since it is provided with a liquid crystal display formed by the method for forming a pattern with a bank structure described in the first embodiment.

The electronic apparatus of the embodiment is equipped with a liquid crystal device, but alternatively it can be equipped with another electro-optical device such as an organic electroluminescent display and a plasma display.

In addition to the electronic apparatuses described above, the embodiment can be applied to various electronic apparatuses. Examples of these electronic apparatuses include: liquid crystal projectors, personal computers (PCs) and engineering work stations (EWS) for multimedia applications, pagers, word processors, televisions, video recorders of viewfinder types or direct monitor types, electronic notebooks, electric calculators, car navigations systems, point-of-sale (POS) terminals, and apparatuses equipped with a touch panel.

While the preferred embodiments according to the invention are described referring to the accompanying drawings, it is understood that the invention is not limited to these examples. The shapes, combinations and the like of each component member described in the foregoing embodiments are illustrative only, and various modifications may be made based on design requirement and the like within the scope of the invention.

For example, in the first embodiment, a structure in which the manganese layer F1 and the bank 34 are fired at once is explained. However, it is not limited to this and the layers can be fired separately. Further, in the first embodiment, a bank structure having a desired pattern is formed by photolithography or etching. However, alternatively, a desired pattern may be formed by patterning with laser instead of the above forming method.

Figure 14:
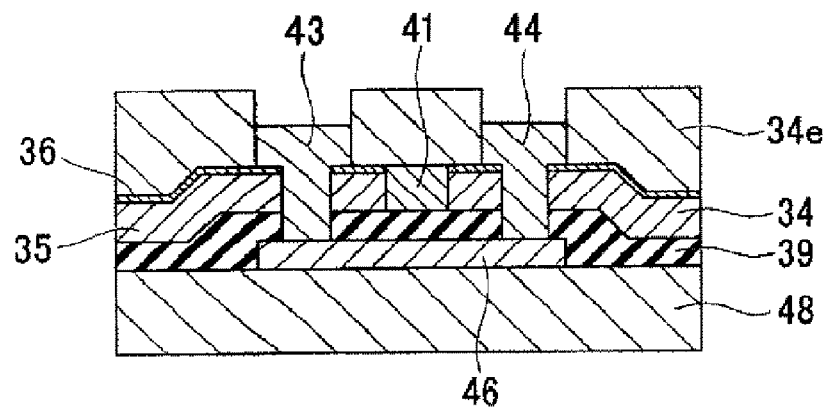
FIG. 14 is a sectional view schematically illustrating an example of an active matrix substrate.
Figure 15:
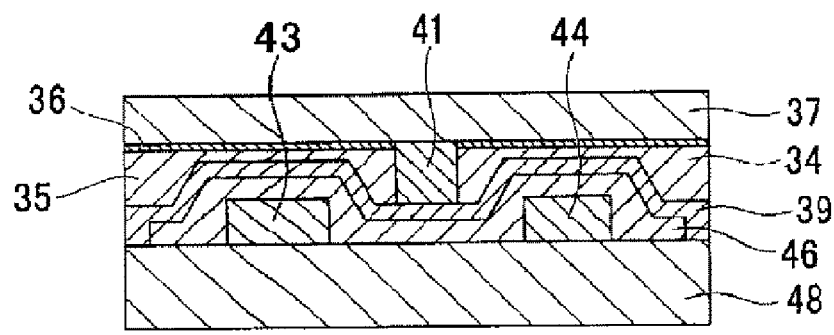
FIG. 15 is a sectional view schematically illustrating another example of an active matrix substrate.

The method for forming a film pattern of the first embodiment also can be applied to manufacture an active matrix substrate as shown in FIGS. 14 and 15. Specifically, FIG. 14 is a schematic sectional view illustrating an example of an active matrix substrate including a transistor of a coplanar structure. In the substrate, a semiconductor layer 46 is formed on a substrate 48, and the gate electrode 41 is formed on the semiconductor layer 46 with the gate insulation film 39 interposed therebetween. The bank 34 surrounds the gate electrode 41 so as to define the pattern of the gate electrode 41. The bank 34 also functions as an interlayer insulation layer. The bank 34 is formed with the second bank layer 36 made of a fluorine resin material so as to be layered on the first bank layer 35, and the gate electrode 41 is formed by the method for forming a film pattern described above.

Formed to the bank 34 and the gate insulation film 39 are contact holes. The source electrode 43 is formed so as to couple to a source region of the semiconductor layer 46 through one contact hole, while the drain electrode 44 is formed so as to couple to a drain region of the semiconductor layer 46 through the other contact hole. To the drain electrode 44, a pixel electrode is connected.

FIG. 15 is a schematic sectional view illustrating an example of an active matrix substrate including a transistor in a stagger structure. In the structure, the source electrode 43 and the drain electrode 44 are formed on the substrate 48, and the semiconductor layer 46 is formed on the source electrode 43 and the drain electrode 44. On the semiconductor layer 46, the gate electrode 41 is formed with the gate insulation film 39 interposed therebetween. The bank 34 surrounds the gate electrode 41 so as to define the pattern of the gate electrode 41. The bank 34 also serves as an interlayer insulation layer. The bank 34 is also formed with the second bank layer 36 made of a fluorine resin material so as to be layered on the first bank layer 35, and the gate electrode 41 is formed by the method for forming a film pattern described above.

To the drain electrode 44, a pixel electrode is connected.

When the above-described active matrix substrates are manufactured, the method for forming a film pattern of the embodiment can be applied. Namely, for example, when the gate electrode 41 is formed in a region surrounded by the bank 34, the gate electrode 41 enabling cost reduction can be formed by applying the method for forming a film pattern according to the first embodiment of the invention. Note that the method for forming a film pattern can be applied to steps to form not only a gate electrode, but also a source electrode, a drain electrode, and a pixel electrode.

What is claimed is:

1. A method for forming a film pattern by disposing a functional liquid in a pattern forming region that is partitioned by a bank, comprising:
    disposing a first bank forming material to a substrate so as to form a first bank layer; and
    forming a second bank layer on the first bank layer, wherein the first bank forming material is an organic material while the second bank layer is made of a fluorine resin material, and wherein a thickness of the second bank layer is smaller than a thickness of the first bank layer, wherein the thickness of the second bank layer is less than 1 µm.

2. The method for forming the film pattern according to claim 1, further comprising:
    disposing a first functional liquid in the pattern forming region;
    forming a first dried film by drying the first functional liquid in the pattern forming region; and
    disposing a second functional liquid on the first dried film, wherein a thickness of the first dried film made of the first functional liquid being dried is smaller than the thickness of the first bank layer.

3. The method for forming the film pattern according to claim 1, further comprising:
    disposing the functional liquid in the pattern forming region;
    forming a dried film by drying the functional liquid in the pattern forming region; and
    firing the bank and the dried film together.

4. The method for forming the film pattern according to claim 3, wherein after a plurality of dried films are layered in the pattern forming region, the plurality of dried films and the bank are fired together.

5. A method for manufacturing an active matrix substrate, comprising:
    (a) forming a gate wiring line on a substrate;
    (b) forming a gate insulation film on the gate wiring line;
    (c) forming a semiconductor layer on the gate insulation film;

(d) forming a source electrode and a drain electrode on the gate insulation film;

(e) disposing an insulation material on the source electrode and the drain electrode;

(f) forming a pixel electrode on the insulation material, wherein the method for forming a film pattern according to claim 1 is used in at least one of steps (a), (d), and (f).

6. A method for manufacturing an active matrix substrate, comprising:

(g) forming a source electrode and a drain electrode on a substrate;

(h) forming a semiconductor layer on the source electrode and the drain electrode;

(i) forming a gate electrode on the semiconductor layer with a gate insulation film interposed between the gate electrode and the semiconductor layer; and (j) forming a pixel electrode so as to be coupled to the drain electrode, wherein the method for forming the film pattern according to claim 1 is used in at least one of steps (g), (i), and (j).

7. A method for manufacturing an active matrix substrate, comprising:

(k) forming a semiconductor layer on a substrate;

(l) forming a gate electrode on the semiconductor layer with a gate insulation film interposed between the gate electrode and the semiconductor layer;

(m) forming a source electrode so as to be coupled to a source region of the semiconductor layer through a first contact hole formed in the gate insulation film, and a drain electrode so as to be coupled to a drain region of the semiconductor layer through a second contact hole formed in the gate insulation film; and (n) forming a pixel electrode so as to be coupled to the drain electrode, wherein the method for forming the film pattern according to claim 1 is used in at least one of steps (l), (m), and (n).

\* \* \* \* \*